MONOLITHIC POWER AMPLIFIER

Filed Oct. 24, 1966

INVENTOR.
Thomas M. Frederiksen

BY
Mueller, Aichele & Rauner
ATTY'S.

United States Patent Office 3,416,092

Patented Dec. 10, 1968

3,416,092
MONOLITHIC POWER AMPLIFIER

Thomas M. Frederiksen, Scottsdale, Ariz., assignor to Motorola, Inc., Franklin Park, Ill., a corporation of Illinois Filed Oct. 24, 1966, Ser. No. 589,115
17 Claims. (Cl. 330—19)

This invention relates generally to transistorized power amplifiers and more particularly to an all NPN monolithic integrated semiconductor power amplifier having an improved linear response characteristic with extremely low distortion in the output signal.

In the past, attempts have been made to construct power amplifiers in monolithic integrated form and thereby provide a monolithic integrated power amplifier circuit which is highly stable, exhibits excellent temperature stability and has a low cross-over distortion. However, known monolithic integrated power amplifiers have been plagued with DC biasing problems and have required, for example, various types of external biasing connections in order to establish the proper DC levels within the monolithic integrated circuit. Such external connections have made these prior art monolithic integrated power amplifiers costly and impractical, easily thermally unbalanced and operationally unstable. In short, absent the present invention there is no monolithic integrated power amplifier presently known which features the proper biasing levels and desirable temperature stability in a circuit exhibiting extreme linearity, an overall operational stability, and a low output signal distortion.

Accordingly, it is an object of this invention to provide a new monolithic integrated semiconductor power amplifier exhibiting excellent linearity and stability, while introducing a minimum of distortion in the output signal thereof.

Another object of this invention is to provide a monolithic integrated power amplifier constructed using transistors only of the NPN type and thereby simplifying the monolithic integrated circuit construction. Such simplified construction is the basis of a minimum production cost.

Another object of this invention is to provide a monolithic integrated power amplifier circuit which is thermally stable and which includes novel bias compensating and DC level shifting components necessary to establish DC bias levels within the circuit.

The amplifier according to the present invention features a novel output section including first and second output transistor portions each having a common collector transistor connection as a driver and which are alternately driven into conduction on each successive half cycle of the input signal. This output section operates quasi class B with a very small dead band in the output signal due to the biasing scheme for the first and second output transistor portions. The output section of the amplifier further includes semiconductor diode coupling circuitry for establishing a desirable load current path to one of the power transistors on one half cycle of the input signal and for providing desirable coupling action to direct the load current to the other output transistor on the other half cycle of the input signal.

Another feature of this invention is the provision of a resistive level shifting network including a current sink and an emitter-follower connected between the input and the output portions of the amplifier to provide a desired DC voltage level at the first and second output transistor portions which is compatible with the output sections of the amplifier.

Another feature of this invention is the provision of a negative feedback network connected between the output of the amplifier and a pair of emitter-coupled, differentially connected input transistors. This feedback network enhances the amplifier gain, stability and linearity and establishes a desired quiescent DC voltage level at the output of the amplifier.

Another feature of this invention is the provision of an external pole splitting capacitor (not part of the resistor-diode-transistor monolithic integrated circuit) which is responsible for a pole splitting action for amplifier operation. A pole is defined as a root of the transfer function of the amplifier which causes the transfer function to go to infinity. This pole splitting action, which will be more fully described hereinafter, imparts to the amplifier a desired gain vs. frequency characteristic.

These and other objects and features of this invention will become more fully apparent in the following description of the accompanying drawings wherein.

Briefly, this invention includes a pair of emitter-coupled, differentially connected transistors, one of which is adapted to receive a varying input signal. These differentially connected transistors are further connected between a current sink and a load impedance for developing a variable voltage at the load impedance in response to amplitude variations in the input signal. A resistive level shifting network including an emitter-follower, a resistor and a current sink is connected to the load impedance for establishing a desired DC voltage level at the output portion of the amplifier. This output portion includes first and second transistor output pairs which are alternately biased into conduction in response to negative and positive going input signals, respectively, applied to the amplifier. These output transistor pairs are connected to an output terminal of the amplifier in order to drive an external load positive and negative in response to input signals applied to the amplifier. A resistive negative feedback circuit is connected between the output terminal of the amplifier and the emitter-coupled pair of differentially connected input transistors to enhance the gain stability and linearity off the circuit and to establish a desired quiescent DC voltage level at the output terminal.

A novel diode coupling network is connected between the first and second transistor output pairs for directing the load current to alternate transistor pairs on negative and positive input signals respectively applied to the amplifier. This diode coupling network further insures that load current will only flow from one of the output transistors during the class B operation of the amplifier. The above-mentioned external pole splitting capacitor which is connected between the diode coupling network and the resistive level shifting network insures that poles of the transfer function of the amplifier circuit are located so that the amplifier will have a gain vs. frequency characteristic which is suitable for an overall negative feedback loop.

Figure 1:
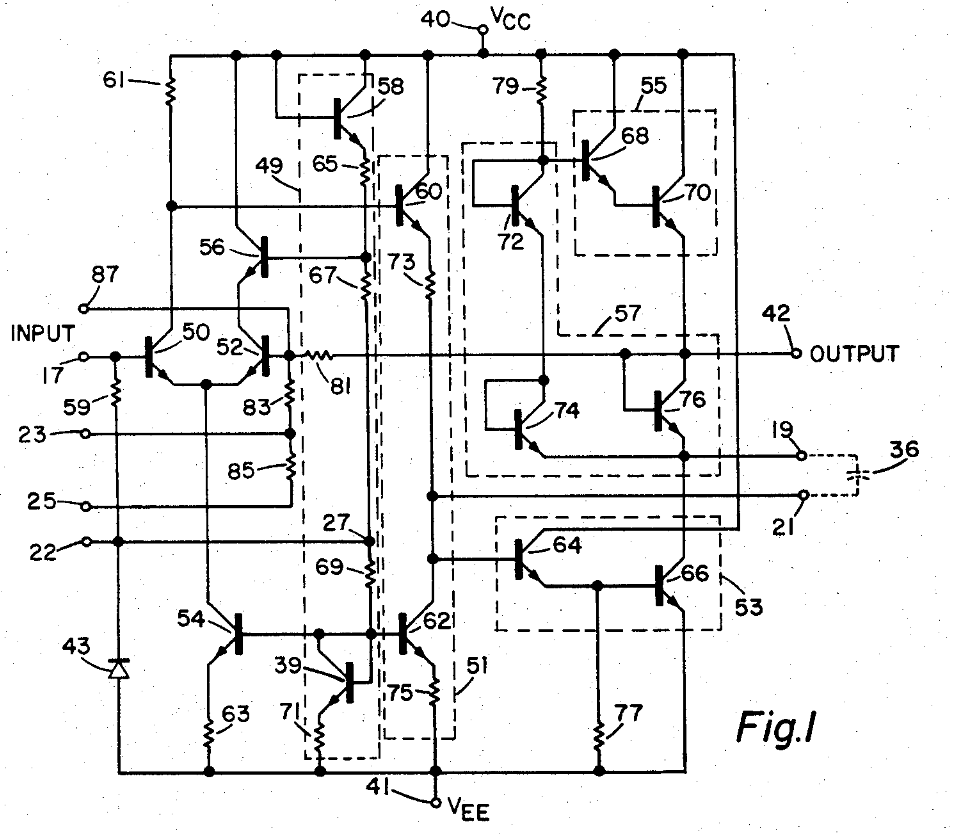
FIG. 1 is a schematic diagram of the monolithic integrated power amplifier according to this invention.

Referring in more detail to the drawings, there is shown in FIG. 1 a monolithic integrated semiconductor power amplifier according to this invention and includes first and second emitter-coupled NPN transistors 50 and 52 connected in a differential circuit configuration with the first input transistor 50 connected to receive input signals at the terminal 17. An NPN current sink transistor 54 is connected at the collector thereof to the common emitter junction of transistors 50 and 52 and is further resistively connected via resistor 63 to a terminal 41 of negative voltage supply. In the single supply operation of the amplifier circuit, the terminal 41 is at ground and the static DC voltage level at the output terminal 42 is halfway between ground and the collector potential $C_{CC}$ applied to positive voltage supply terminal 40. Using dual supplies or the so-called "split supply" connection, terminal 41 has a negative voltage applied which is equal in magnitude and opposite in polarity to the positive voltage which is applied at terminal 40; for the split supply operation the DC static level of the output terminal 42 will be at 0 volt. The following description of FIG. 1 will be presented with reference to the single supply operation of FIG. 1 and in a later portion of the specification the split supply operation will be explained by comparing the circuits of FIGS. 2 and 3.

The circuit of FIG. 1 further includes a serially connected diode-resistor biasing network 49 including transistors 58 and 39. A level setting transintor 56 is connected in the collector circuit of transistor 52 and to a point between resistors 65 and 67 in order to reduce imbalance of the differential circuit by establishing a collector-to-base voltage for transistor 52 equal to that of transistor 50. A resistive level shifting network 51 couples the collector of the first input transistor 50 to a first output transistor circuit portion 53 including transistors 64 and 66 connected as a common collector, common emitter pair. The level shifting network 51 includes an emitter-follower transistor 60 serially connected to resistor 73 and a current sink transistor 62.

In addition to the first output transistor circuit portion 53, the output section of the amplifier includes a second output transistor circuit portion 55 consisting of transistor 68 and 70 connected as a Darlington pair. A diode coupling network 57 interconnects the first and second output transistor circuit portions 53 and 55 and this coupling network includes a first diode 76 connected in series between the output transistors 66 and 70, and second and third serially connected diodes 72 and 74 connected between the base of transistor 68 and the collector of transistor 66.

The above general circuit description is presented for the purpose of identifying the various circuit portions and transistors therein which will be explained in more detail below with reference to the operation of the amplifier.

*Description of operation*

Upon the application of input signals to the base of transistor 50, the conductivity of the first and second emitter-coupled transistors 50 and 52 will be differentially varied, the sum of the currents from transistors 50 and 52 flowing into the constant current sink transistor 54 will be substantially constant. When the input signal at the base of transistor 50 swings in the negative direction, transistor 50 tends to turn off and the voltage at the base of emitter-follower transistor 60 rises, tending to increase the conduction of this transistor. An increase in voltage at the base of transistor 60 produces a corresponding positive voltage transition at the base of the first input transistor 64 of the transistor output pair 64 and 66. This positive voltage transition drives transistors 64 and 66 into conduction which causes the diode connected transistor 76 to conduct and pulls the voltage at the output terminal 42 in a negative direction. Conversely, if the input signal applied to the base of the first input transistor 50 swings in a positive direction, a negative voltage transition will be coupled through emitter-follower transistor 60. This negative transition tends to turn off the transistor output pair 64 and 66 and causes the voltage at the input to transistor output pair 55 to swing positive.

As the voltage level at the input to transistor output pair 55 begins to rise, the voltage level at the base of the Darlington connected transistor 68 also begins to rise and the Darlington connected transistors 68 and 70 provide a conductive path from the bias resistor 79 to an output load resistor (not shown) which is connected to the output terimnal 42. However, the second and third transistor-diodes 72 and 74 clamp the voltage between the collector of the second output transistor 66 and the base of the third Darlington connected transistor 68 at two base-emitter voltage drops ($2V_{BE}$) and prevent the Darlington connected transistors 68 and 70 and the transistor-diode 76 from conducting simultaneously. This prevents a heavy current flow from the second output transistor portion 55 to the first output transistor portion 53 which are directly across the power supplies. Diodes 72 and 74 and the transistor pair 53 conduct for essentially the complete cycle of the input signal.

The particular diode coupling network 57 produces a dead band and a small amount of crossover distortion in the output signal as the output transistors 66 and 70 alternately conduct the load current. However, any crossover distortion in the output signal is minimized due to the fact that negative feedback is provided between the output terminal 42 and the base of the second emitter-coupled transistor 52. The feedback voltage at the base of transistor 52 closely follows any minor distortion in the output signal and produces a correcting signal to remove the distortion from the overall operation of the amplifier.

The output transistors 66 and 70 in the first and second output transistor portions 53 and 55 are driven by emitter-followers 64 and 68 respectively to insure a high current gain in the output section of the amplifier. The connection of the Darlington pair 68, 70 limits the available positive output swing at terminal 42 to approximately $+V_{CC}-2V_{BE}$, but at the same time provides increased loop stability since the output transistor 70 is operating as a common collector amplifier driven by a low impedance source. With regard to the output transistor portions 53 and 55, it will be readily appreciated by those skilled in the art that a single transistor could replace the transistor pairs in each of the transistor portions shown without departing from the scope of this invention. Such a modification of the amplifier circuit would, of course, reduce the current gain and drive capability of the circuit.

In the output stage of the amplifier according to this invention, the load impedance which is presented to transistor 66 is unsymmetrical and produces changes in the open loop gain of the amplifier. During the negative output voltage swing, diode 76 is conducting and the load resistance for transistor 66 is small, consisting essentially of the small valued external load impedance (not shown) connected to the output terminal 42. However, during the positive output voltage swing, the diode 76 is non-conducting and the Darlington pair of transistors 68 and 70 is now active to mulitply the load impedance by $h_{FE}^2$ where $h_{FE}$ is defined as the short circuit current gain which is the ratio of a small change in collector current to a smaller change in base current (required to produce the change in collector current) while the collector-emitter voltage is held constant.

This elevated impedance presented to transistor 66 is shunted by resistor 79 and the small resistance contribution of diodes 72 and 74 is negligible. Since the parallel combination of resistor 79 and the Darlington pair of transistors 68 and 70 represents a large increase in the load resistance of transistor 66 relative to its load resistance on the negative output voltage swing, this characteristic of the amplifier could produce an undesirable corresponding increase in the open loop gain of the amplifier and corresponding positive swing instability for closed loop operation. However, in the amplifier construction according to this invention, the resistor 79 has a resistance sufficiently low (approximately 1 kilohm) that this resistance will dominate the $h_{FE}^2$ dependent input impedance of transistors 68 and 70 and thereby will more nearly equalize the gain of the amplifier. It is possible to select a resistor 79 having a very low resistance value; however, if the value of resistor 79 is too small, the standby current will be increased by an undesirable amount.

The resistor 73 in combination with the external capacitor 36 is part of the pole splitting scheme of this invention which will be discussed later. This resistor also provides a means for shifting the DC level between the collector of transistor 50 and the input to the base of transistor 64. Transistor 62 acts as a constant current source and may pull up to one milliamp of current through resistor 73 in normal circuit operation. By using a constant current source transistor 62, the signal at the input of trnasistor 64 is not significantly shunted. The emitter-follower transistor 60, as previously explained, couples the output of the differential amplifier stage in a manner that provdies isolation between the load resistor 61 and the emitter-follower resistor 73. This coupling scheme prevents loading of the resistor 61 by the emitter-follower resistor 73, and additionally reduces the capacitive loading across load resistor 61.

The base of transistor 62 is voltage driven by the transistor-diode 39 of the bias string which includes resistors 65, 67, 69, 71 and the diodes 58 and 39. This bias string is used to provide a conventional matched-diode, temperature compensating biasing arrangement, with diode 39 used to bias both the current source transistor 54 for the differential amplifier stage and the current source transistor 62. For the component values given below the current sink transistor 54 pulls approximately 0.7 milliamp of current and the current sink transistor 54 pulls approximately one milliamp of current as stated earlier.

The input differential amplifier stage including transistors 50 and 52 provide a convenient means for comparing the signal from the feedback circuit including resistors 81, 83 and 85 between this stage the output terminal 42 to the input signal in an overall negative feedback loop. Taps 87 and 23 are available if it is desired to alter the feedback network by these external pin options to change the gain of the amplifier. For this amplifier the closed loop gain is approxiamtely equal to the ratio of resistor 81 to combinations of resistors 83 and 85 (or any external resistance which may be added from point 87 to AC ground). The various taps 87, 23 and 25 enable resistors 83 and 85 to be used in the following three combinations: (1) resistor 83 in series with rseistor 85, (2) resistor 83 alone, and (3) resistor 83 in parallel with resistor 85 to provide three distinct optional values of closed loop gain. If resistors 59 and 81 are equal in value, the resulting voltage drops across the resistors as a result of the base currents of the input differential amplifier stage may be made nearly equal in value which will not significantly affect the desired balance of the input differential amplifier stage.

If the amplifier circuit is to be operated with a split supply (with $V_{EE}$ equal in value and opposite in sign to $V_{CC}$) terminal 22 is connected to ground potential. With terminal 22 grounded, the output terminal 42 will also setup near ground and direct coupling to an external load is possible. For single supply operation, as previously mentioned, terminal 22 is left open or AC bypassed and will exist at approximately $V_{CC}/2$ for all temperatures and will provide the output reference.

Figure 2:
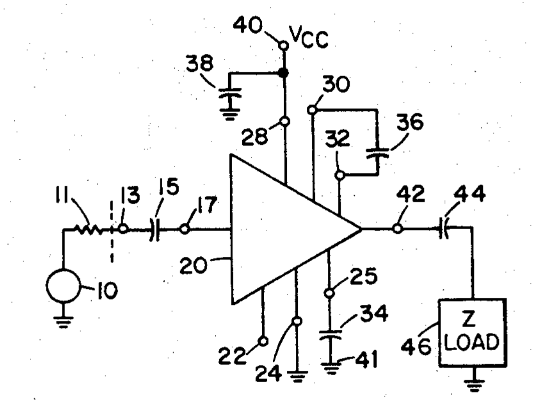
FIG. 2 is another diagram of the power amplifier, part schematic and part functional, and illustrates the "single ended" amplifier connection for the schematic diagram of FIG. 1.
Figure 3:
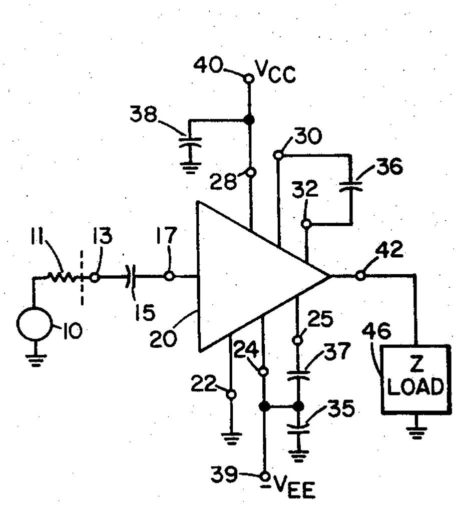
FIG. 3 is a diagram similar to that shown in FIG. 2 and illustrates the split voltage supply or double ended connection for the amplifier of FIG. 1.

Typical connections are shown in FIGS. 2 and 3 for single supply operation and split supply operation, respectively. The values of capacitors 35 and 38 depend upon the power supply impedance and are normally in the order of ten microfarads or less. Operating with a split supply voltage, capacitor 37 may be returned to $-V_{EE}$ in order to provide proper DC biasing for this electrolytic capacitor. This capacitor is used in the overall feedback network to increase the temperature stability or the output Q point as will be discussed later.

It will be observed that the output coupling capacitor 44 in FIG. 2 is not present in FIG. 3 since split supply operation results in a DC reference level of zero volts at terminal 42 and therefore no output capacitor is required. Consequently, for the split supply operation the output terminal 42 may be connected directly to a load impedance such as a speaker voice coil or the like.

The low frequency characteristics of the amplifier circuit are determined by the input and output coupling capacitors 15 and 44, respectively, and the feedback capacitor 34 or 37. The input coupling capacitor 15 in FIG. 2 and FIG. 3 establishes, in combination with the input impedance of the amplifier and identified herein as $Z_{IN}$, a low frequency "corner" on the gain vs. frequency characteristic of the amplifier. When the amplifier is coupled to a singe voltage supply (FIG. 2) the output coupling capacitor 44 and the output impedance Z load connected thereto establish a second independent low frequency corner on the gain vs. frequency characteristic.

The capacitor 34 or 37 which is connected to the feedback network including resistors 81, 83 and 85 at point 25 produces a so-called doublet response at low frequencies, and since the closed loop gain of the amplifier is approximately equal to the reciprocal of the feedback factor of the amplifier the presence of capacitor 34 or 37 in the circuit causes a frequency response of the amplifier closed loop gain which starts at DC with a value of unity. In the amplifier of FIG. 2 a zero occurs at $$\omega_z=\frac{1}{(R81+R83+R85)(C34)}$$

and the amplifier gain rises at 6 db per octave until the pole $$\omega_p=\frac{1}{(R83+R85)(C34)}$$

is reached. $\omega_z$ and $\omega_p$ are defined as the frequencies at which a zero and a pole, respectively, occur for the transfer function of the voltage gain of the amplifier. For frequencies above this pole, $\omega_p$, the amplifier gain is constant at $$\frac{R81+(R83+R85)}{(R83+R85)}$$

until the upper band edge of the gain vs. frequency characteristic is reached or the large signal slew rate limit of the amplifier distorts and attenuates the signal. This so-called slew rate limit is a result of the inability of the signal current which is available from resistor 73 to supply the current requirements of the external capacitor 36 at high frequencies. This limits the large signal bandwidth of the amplifier as the input to the transistor pair 53 becomes attenuated and distorted. Since the low frequency poles do not mutually interact it is possible to maintain excellent control over the low end skirt shape of the gain vs. frequency characteristic of the amplifier. For a dominant 6 db per octave low frequency skirt for the gain vs. frequency characteristic, the input capacitor 15 and the capacitor 34 or 37 in the feedback network of the amplifier can be narrow banded to $\omega_1/4$ and the large valued output coupling capacitor C44 establishes $\omega_1$, where $\omega_1$ is defined as the dominant low frequency corner. There is no high frequency band limiting built into the amplifier but high-end narrow banding can be easily obtained by adding a shunt capacitance, $Cs$, at the input of the amplifier. Shunt capacitance $Cs$ establishes a corner frequency at $$\omega_h=\frac{1}{RsCs}$$

where $Rs$ represents the series resistance 11 and $Cs$ represents the shunt capacitance.

The thermal compensating nature of the differential amplifier stage is worsened by the three base-emitter drops of transistors 60, 64 and 66 which tend to introduce a temperature dependent output quiescent (Q) point at terminal 42. At the same time, transistors 68 and 70 introduce only a negligible thermal drift at the output quiescent point. However, a temperature dependent DC voltage source which is inserted in the forward circuit of the amplifier is reduced in its affect on the quiescent DC level at the output terminal 42 by the product of the gain ahead of the point at which the source is inserted and the DC feedback factor of the amplifier. Therefore, by connecting an external capacitor 34 or 37 between terminal 25 and AC ground to increase the AC feedback factor from a fraction 1/10 or 1/20 or 1/40 to 1, the Q point stability at the output terminal 42 is highly improved by factors of 10, 20 or 40 depending upon the gain tap used, i.e., depending upon whether resistor 81 is used with resistors 83 and 85 in series, resistor 83 only, or resistors 83 and 85 in parallel.

For single supply operation, the DC resistance in the base circuits of input transistors 50 and 52 is unbalanced. Transistor 50 has an effective base resistance equal to the vlaue of resistor 59 plus the source resistance of terminal 27 which is resistor 65 plus 67 in parallel with resistor 69 plus 71. This latter resistance causes an unbalance in base resistance in the differential amplifier stage of as much as 32%. This will introduce a small offset voltage at the output terminal 42 of approximately 20 millivolts. However, this small offset voltage has no detrimental effect on the performance of the amplifier circuit since the output Q point is not critical for capacitive coupling to a load at terminal 42 as shown in FIG. 2. For split supply operation and direct coupling to a low DC load impedance, such as the voice coil of a loud speaker, the center point 22 of the diode-resistor bias string described above is grounded. This removes this base resistance unbalance in the differential amplifier and establishes a zero volt DC reference for control of the output Q point at terminal 42. Thus, the best Q point setup is obtained operating with a split supply voltage and directly coupling the amplifier output to a load impedance.

For the equivalent AC circuit of the amplifier, the uncompensated open loop amplifier has three dominant poles; one at the collector of transistor 50 and referenced herein as $p_1$, the input to transistor 64 and referenced herein as $p_2$, and a third pole is at the input to transistor 68 and referenced herein as $p_3$. In order to obtain overall negative feedback without instability a dominant single-pole open-loop response is desirable. This is achieved by designing $p_1$ for a high frequency and splitting $p_2$ and $p_3$ apart by use of an external capacitor 36. The value of capacitor 36 is in the order of 22 microfarads and causes poles $p_2$ and $p_3$ to interact in such a manner that pole $p_2$ narrow-bands and becomes the single dominant pole whereas pole $p_3$ broad-bands and becomes non-dominant. Thus, the single-pole open-loop response and accompanying closed loop stability are achieved primarily by the use of the external pole splitting capacitor 36.

The open-loop voltage gain of the amplifier according to this invention has been measured at 670 producing a loop gain of 67 for a closed loop gain of 10 using a 16 ohm load resistance connected to the output terminal 42. By using only a voltage gain of 10 in the final closed-loop amplifier, out of the available open-loop gain of 670, the loss of the surplus open-loop gain, so-called loop gain, is exchanged for improved closed-loop amplifier performance by the use of negative feedback. The open-loop gain is dependent upon the external load impedance, and for values of load impedance at and below approximately 3 ohms the distortion rises and less closed-loop gain must be accepted to achieve reasonable fidelity. This is commonly in the order of 2 or 3.

The presence of the overall feedback loop elevates the input impedance of the input differential amplifier stage and consequently the input resistor 59 establishes the amplifier input impedance. The output impedance is also reduced by the action of the overall negative feedback loop which provides a voltage source drive to the load. In audio amplifier service, this creates heavy speaker damping and gives the quality of "transistor sound" to music reproduction due to the resulting low speaker distortion.

Another important feature of this invention is the protection diode 43 which is connected between voltage supply $V_{EE}$ and point 22 in the circuit. The diode 43 will prevent catastrophic current flow in the load if the $-V_{EE}$ lead is accidentally opened while a voltage at $V_{CC}$ is present. Should this occur, the protection diode 43 will conduct and the amplifier will operate in a manner similar to the normal single supply mode and the output point 42 will not rise to as high a positive level. For the single supply operation, however, with $V_{EE}$ grounded, the diode 43 is disconnected from the circuit due to the resulting off bias and does not affect the operation thereof.

The all NPN transistor amplifier according to this invention has been constructed using photolithographic techniques to thereby form a monolithic integrated circuit structure. By using all NPN transistors, transistor-diodes and resistors, it has been possible to construct a general purpose low frequency power amplifier at an extremely low cost.

The following table of values for resistances, voltages and current in the amplifier circuit under static DC conditions and operating with a single supply ($V_{EE}$ at ground) are given by illustration only. These values were used in an amplifier circuit actually built and successfully operated. However, these values should not be construed as limiting the scope of this invention.

TABLE

| | | |
|---|---|---|
| $V_{CC}$ | volts | +14 |
| $V_{EE}$ | do | 0 |
| Internal resistors: | | |
| R59 | | 10KΩ |
| R61 | | 10KΩ |
| R63 | | 270Ω |
| R65 | | 2.1KΩ |
| R67 | | 4.2KΩ |
| R69 | | 6.1KΩ |
| R71 | | 200Ω |
| R73 | | 8.2KΩ |
| R75 | | 200Ω |
| R77 | | 2KΩ |
| R79 | | 1KΩ |
| R81 | | 10KΩ |
| R83 | | 500Ω |
| R85 | | 500Ω |
| External capacitors: | | |
| C15 | microfarads | 1 |
| C34 | do | 10 |
| C35 | do | 10 |
| C36 | picofarads | 22 |
| C37 | microfarads | 1.5 |
| C38 | do | 10 |
| C44 | do | 100 |

I claim:

1. An electronic amplifier including, in combination;

(a) a pair of differentially connected input transistors, one of which is adapted to receive a signal to be amplified, and a first current sink connected to a common current output point of the pair of differentially connected transistors for sinking the sum of the currents which flow differentially in the pair of input transistors, (b) a load impedance connected between one of the input transistors in said pair and a voltage supply terminal for developing a variable voltage thereat in response to changes in the level of the input signal, (c) resistive level shifting means connected to said load impedance means for providing a DC level shift from the DC voltage level appearing at said load impedance means, (d) a first output transistor circuit portion connected between said resistive level shifting means and an output terminal and responsive to changes in voltage at said resistive level shifting means to produce a corresponding change in the voltage at said output terminal, (e) a second output transistor circuit portion connected between said voltage supply terminal and said output terminal and conductively controlled by the voltage level at said resistive level shifting means, (f) semiconductor diode coupling means connected between said first output transistor circuit portion and said second output transistor portion for directing the load current to said second output transistor circuit portion on one half cycle of said input signal and for directing the load current to said first transistor circuit portion on the other half cycle of said input signal, said semiconductor diode coupling means preventing excessive current flow from said second output transistor circuit portion to said first output transistor circuit portion during the amplification of input signals applied to said input terminal.

2. The electronic amplifier according to claim 1 which further includes negative feedback means connected between said output terminal and the other transistor of said pair of differentially connected input transistors for providing a signal to said other of said pair of input transistors which opposes conduction of said one of said pair of input transistors and thereby stabilies the closed loop gain of said amplifier.

3. The electronic amplifier according to claim 2 wherein:

(a) said resistive level shifting means includes an emitter-follower and a second current sink serially across a power supply, said resistive level shifting means connected between said load impedance and the output of the output amplifier for providing a voltage drop in said emitter-follower and its associated resistor to shift the DC level from that existing at said load impedance means to a DC level compatible with the said first output transistor portion, (b) said first output transistor circuit portion comprising a first pair of cascaded transistors connected between said emitter-follower and its associated resistor and said output terminal and operative to conduct on said one half cycle of the input signal to reduce the voltage level at the output terminal, and (c) said second output transistor circuit portion including a second pair of cascaded transistors connected between said voltage supply terminal and said output terminal and operative to conduct on the other half cycle of the input signal to provide current to a load connectable to said output terminal and a corresponding increase in voltage at said output terminal.

4. The electronic amplifier according to claim 3 which includes a pole splitting capacitor connected between said resistive level shifting means and said semiconductor diode coupling means for causing two of the poles of the transfer function of the amplifier to interact and split apart in such a manner that one of the poles is narrow-banded and becomes the single dominant pole which is desirable for an overall feedback amplifier while the other pole is simultaneously broad-banded so as to not cause instability of the feedback amplifier.

5. The electronic amplifier according to claim 4 wherein said semiconductor diode coupling means includes:

(a) a first diode serially connected between said first and second output transistor portions, and (b) second and third serially connected diodes shunting said second output transistor circuit portion and said first diode for clamping the voltage level at said second output transistor circuit portion and said first diode thereby preventing undesired simultaneous current flow from said second output transistor circuit portion and through said first diode into said first output transistor circuit portion.

6. The electronic amplifier according to claim 5 which further includes resistive biasing means connected between said supply voltage terminal which is positive and a negative supply voltage terminal, and (b) a level setting transistor connected between the other of said pair of input transistors and said voltage supply terminal and connected to said resistive biasing means for establishing a DC collector voltage level at the other of said input pair of differentially connected transistors which is equal to the DC collector voltage level at said one of said input pair of differentially connected transistors, said level setting transistor eliminating undesired input voltage imbalance of said differentially connected transistors which would arise from the otherwise unequal DC collector voltage levels for said differentially connected transistors.

7. The electronic amplifier according to claim 6 wherein said resistive biasing means includes a pair of diodes interconnected by resistors in a series network between said positive voltage supply terminal and said negative voltage supply terminal, one of said pair of diodes resistively connected between said positive voltage supply terminal and said level setting transistors and the other of said pair of diodes connected to a common junction of said current sinks and then to said negative voltage supply terminal for establishing a constant DC current in said current sinks.

8. In a monolithic semiconductor integrated power amplifier having first and second differentially connected input transistors connected to a current sink and operative to pull differential currents through the respective collectors thereof in response to the changing level of input signals applied to the first of the differentially connected input transistors, a load impedance connected between the collector of one of the first and second differentially connected input transistors and the positive voltage supply terminal for developing a varying voltage in response to the changing level of the input signals, the improvement comprising:

(a) a DC level shifting network connected to said load impedance and between said positive voltage supply terminal and said negative voltage supply terminal for establishing a DC level at the output of said network which is compatible with an output stage of the amplifier, said output stage including (b) a first output transistor portion comprising at least two transistors cascaded between the output of said DC level shifting network and an output terminal of the amplifier and operative to conduct on one half cycle of the input signal and reduce the voltage at said output terminal of the amplifier, (c) second output transistor portion including at least two cascaded transistors connected between a voltage supply terminal and said output terminal and operative to conduct on the other half cycle of the input signal to provide load current to said output terminal, and (d) semiconductor diode coupling means connected between said first and second output transistor portions of said amplifier for providing a load current path to said first output transistor portion on one half cycle of the input signal and to said second output transistor portion on the other half cycle of the input signal.

9. The circuit according to claim 8 which includes a pole splitting capacitor connected between said resistive level shifting means and said semiconductor diode coupling means for causing two of the poles of the transfer function of the amplifier to interact and split apart in such a manner that one of the poles is narrow-banded and becomes the single dominant pole which is desirable for an overall feedback amplifier while the other pole is simultaneously broad-banded so as to not cause instability of the feedback amplifier.

10. The integrated amplifier circuit according to claim 8 wherein:

(a) said semiconductor coupling means includes a first diode interconnecting the two cascaded transistors in the first output transistor portion to the two cascaded transistors in the second output transistor portion, second and third diodes connected between said first diode and said second output transistor portion and providing a load current path to said first output transistor portion when the two transistors therein are conducting during one half cycle of the input signal and for transferring the load current to the transistor in the second output transistor portion during the other half cycle of the input signal, said circuit further including (b) a pair of terminals for connecting an external pole splitting capacitor between said resistive level shifting network and said semiconductor clamping means, said pole splitting capacitor causing two of the poles of the transfer function of the amplifier to interact and split apart in such a manner that one of the poles is narrow-banded and becomes the single dominant pole which is desirable for an overall feedback amplifier while the other pole is simultaneously broad-banded so as to not cause instability of the feedback amplifier.

11. The amplifier circuit according to claim 10 which further includes:

(a) a level setting transistor connected between the second of the differentially connected input transistors and said positive voltage supply terminal, (b) a serially connected diode-resistor biasing network connected between said positive and negative voltage supply terminals and having a resistive tap thereon connected to said level setting transistors for providing a DC voltage level at the collector of the other of the first and second differentially connected transistors equal to the DC voltage level at said one of the first and second differentially connected input transistors, and (c) said diode-resistor biasing network further including said current sink resistively connected to said negative voltage supply terminal for establishing constant currents through said current sink transistors.

12. The amplifier circuit according to claim 10 which further includes:

(a) a negative feedback resistor connected between said output terminal of the amplifier and one of the first and second differentially connected input transistors for providing a feedback voltage at said one input transistor which opposes the conductivity in the other input transistor and thereby linearizes said amplifier circuit.

13. The amplifier circuit according to claim 12 which includes multiple tap resistance means connected between said feedback resistor and a point of reference potential for developing a fraction of the voltage appearing at said output terminals at said one input transistor.

14. The amplifier circuit according to claim 13 which further includes:

(a) a first bias resistor connected between said positive voltage supply terminal and one of the two cascaded transistors in said second output transistor portion for providing drive current to said second output transistor portion and said second and third serially connected diodes, and (b) a second bias resistor connected between the base one of the two cascaded transistors in said first output transistor portion and said negative voltage supply terminal for providing biasing for said first output transistor portion.

15. A monolithic integrated semiconductor power amplifier constructed of resistors, transistors and transistor-diodes, all transistors being of the NPN variety and all having emitter, base and collectors, said resistors interconnected in said circuit to provide desirable voltage levels at various points within the circuit, said amplifier including, in combination:

(a) first and second emitter-coupled, differentially connected input transistors, one of which has a load resistor connected in the collector circuit thereof and the other of which has a level setting transistor in the collector circuit thereof, (b) a first current sink transistor connected to the emitter-coupled regions of the first and second input transistors and further resistively connected to a negative voltage supply terminal for sinking a constant current from said first and second emitter-coupled input transistors, (c) an emitter-follower connected to the load resistor in the collector circuit of one of the first and second emitter-coupled input transistors and further connected to a second constant current sink consisting of a serially connected transistor and resistor, (d) first and second output transistors connected in a common collector, common emitter cascade between said emitter-follower and its associated resistor and said negative power supply terminal for providing a current path therethrough, (e) third and fourth output transistors connected in a Darlington string between a positive voltage supply terminal and an output terminal of said amplifier for delivering current to said output terminal when the input voltage at the output of said emitter-follower swings in a negative direction, (f) a bias resistor connected between the base of said third output transistor and said positive voltage supply terminal, (g) a first coupling diode connected between said second and fourth output transistors for preventing current flow from said fourth output transistor to said second output transistor when used with said associated coupling diode, and (h) second and third serially connected diodes connected between said second and third output transistors for providing a load current path to said second transistor when the output voltage at said emitter-follower swings in one direction and for transferring the load current to the fourth output transistor when the emitter-follower output voltage swings in an opposite direction, first and second terminals connected respectively to said emitter-follower and to said first diode for connecting an external capacitor therebetween, said external capacitor providing pole splitting action in said amplifier and causing two of the poles of the transfer function of the amplifier to interact and split apart in such a manner that one of the poles is narrow-banded and becomes the single dominant pole which is desirable for an overall feedback amplifier while the other pole is simultaneously broad-banded so as to not cause instability of the feedback amplifier, a first feedback resistor connected between said output terminal and said second emitter-coupled input transistor for providing a negative feedback signal at said second emitter-coupled input transistor, resistive means connected between the base of said second emitter-coupled input transistor and a point of reference potential for developing a portion of said output voltage at said base of said second emitter-coupled input transistor which opposes the conductivity in said first emitter-coupled input transistor.

16. The amplifier according to claim 15 which further includes:

(a) a serially connected diode-resistor biasing network connected between said positive voltage supply terminal and said negative voltage supply terminal, said network including a tap for biasing said level setting transistor in the collector circuit of said second emitter-coupled transistor, a tap for output quiescent point reference and a second diode and resistor connected between said negative voltage supply terminal and used to bias said first and second current sink transistors for establishing a constant current through said current sink transistors, said first current sink transistor biasing said differentially connected transistor pair and said second current sink transistor providing a proper DC voltage level shift to said first output transistor and thereby maintaining the base voltage for said first output transistor at a proper DC level, and (b) a protection diode connected between said biasing network at said point of output quiescent point reference and said negative voltage supply terminal.

17. An electronic amplifier including, in combination;

(a) a pair of differentially connected input transistors, one of which is adapted to receive a signal to be amplified, and a first current sink connected to a common current output point of the pair of differentially connected transistors for sinking the sum of the currents which flow differentially in the pair of input transistors, (b) a load impedance connected between one of the input transistors in said pair and a voltage supply terminal for developing a variable voltage thereat in response to changes in the level of the input signal, (c) DC level shifting means connected to said load impedance means for providing a DC level shift from the DC voltage level appearing at said load impedance means, (d) a first output transistor circuit portion connected between said DC level shifting means and an output terminal and responsive to changes in voltage at said DC level shifting means to produce a corresponding change in the voltage at said output terminal, (e) a second output transistor circuit portion connected between said voltage supply terminal and said output terminal and conductively controlled by the voltage level at said DC level shifting means, said first and second output transistor circuit portions being alternately driven into conduction on each successive half cycle of the input signal, and (f) a negative feedback means connected between said output terminal and the other of said differentially connected input transistor.

No references cited.

JOHN KOMINSKI, *Primary Examiner.*

U.S. Cl. X.R.

330—38, 28, 69, 20